US008582245B2

(12) United States Patent
Hanya et al.

(10) Patent No.: US 8,582,245 B2
(45) Date of Patent: Nov. 12, 2013

(54) ELECTRICAL CONNECTION STRUCTURE FOR PIEZOELECTRIC ELEMENT AND HEAD SUSPENSION WITH THE ELECTRICAL CONNECTION STRUCTURE

(75) Inventors: Masao Hanya, Aikoh-gun (JP); Isamu Kuchiwaki, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 13/401,275

(22) Filed: Feb. 21, 2012

(65) Prior Publication Data

US 2012/0224282 A1 Sep. 6, 2012

(30) Foreign Application Priority Data

Mar. 3, 2011 (JP) ................................. 2011-046380

(51) Int. Cl.
*G11B 5/55* (2006.01)
*G11B 5/56* (2006.01)

(52) U.S. Cl.
USPC .................. 360/245.9; 360/294.4; 360/245.8

(58) Field of Classification Search
USPC .................................. 360/245.8, 245.9, 294.4
See application file for complete search history.

(56) References Cited

U.S. PATENT DOCUMENTS

| 8,149,542 B2* | 4/2012 | Ando .......................... 360/245.8 |
| 8,199,442 B2* | 6/2012 | Okawara et al. ........... 360/294.4 |
| 8,248,731 B2* | 8/2012 | Fuchino ..................... 360/245.8 |
| 8,248,734 B2* | 8/2012 | Fuchino ..................... 360/294.4 |
| 8,351,160 B2* | 1/2013 | Fujimoto .................... 360/245.8 |
| 2010/0067151 A1* | 3/2010 | Okawara et al. ............... 360/294 |
| 2010/0165515 A1* | 7/2010 | Ando ............................ 360/290 |
| 2010/0165516 A1* | 7/2010 | Fuchino ..................... 360/294.4 |
| 2011/0141624 A1* | 6/2011 | Fuchino et al. ............ 360/244.2 |
| 2011/0279929 A1* | 11/2011 | Kin ............................ 360/294.4 |

FOREIGN PATENT DOCUMENTS

JP 2002-184140 6/2002
JP 2010086649 A * 4/2010

* cited by examiner

*Primary Examiner* — Will J Klimowicz
(74) *Attorney, Agent, or Firm* — Jordan and Hamburg LLP (57) ABSTRACT

An electrical connection structure for a piezoelectric element and a head suspension with the piezoelectric element employing the electrical connection structure are provided. The electrical connection structure fixes and connects a terminal of a wiring member to an electrode of the piezoelectric element, which is arranged to face the terminal, with a conductive adhesive so that no peeling due to thermal expansion occurs between the terminal and the conductive adhesive. The electrical connection structure includes a through hole formed through the terminal and a connection part formed around the through hole on an opposite side of a piezoelectric element on the terminal. The conductive adhesive is applied and solidified so that the conductive adhesive extends between a surface of the connection part and a surface of the electrode of the piezoelectric element through the through hole.

12 Claims, 8 Drawing Sheets

ELECTRICAL CONNECTION STRUCTURE FOR PIEZOELECTRIC ELEMENT AND HEAD SUSPENSION WITH THE ELECTRICAL CONNECTION STRUCTURE

BACKGROUND OF THE INVENTION

1. Field of the Invention

The present invention relates to an electrical connection structure between an electrode of a piezoelectric element and a wiring member, and also, to a head suspension employing the electrical connection structure, the head suspension supporting a magnetic head to write and read data to and from a magnetic disk in a magnetic disk drive or hard disk drive.

2. Description of Related Art

Small-sized precision information devices are rapidly advancing, and for use with such devices, needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The magnetic disk drives increase their storage capacity by increasing the number of tracks per inch (TPI) of a magnetic disk, i.e., by narrowing the width of each track on the magnetic disk.

The magnetic disk drive, therefore, needs an actuator capable of precisely positioning the magnetic head within a minute range across tracks.

To meet the need, Japanese Unexamined Patent Application Publication No. 2002-184140 discloses a head suspension with a dual actuator system. The dual actuator system employs a piezoelectric element in addition to a usual voice coil motor that drives a carriage to which the head suspension is attached. The piezoelectric element is arranged between a base plate and a load beam of the head suspension, to minutely move a magnetic head attached to a front end of the load beam.

According to the head suspension of the dual actuator system, the voice coil motor turns the head suspension through the carriage, and in addition, the piezoelectric element deforms in proportion to a voltage applied thereto, to minutely move the magnetic head at the front end of the load beam in a sway direction (a widthwise direction of the load beam) relative to the base plate. With the dual actuator system involving the voice coil motor and piezoelectric element, the head suspension is capable of precisely positioning the magnetic head to a target position on a magnetic disk.

Figure 11:
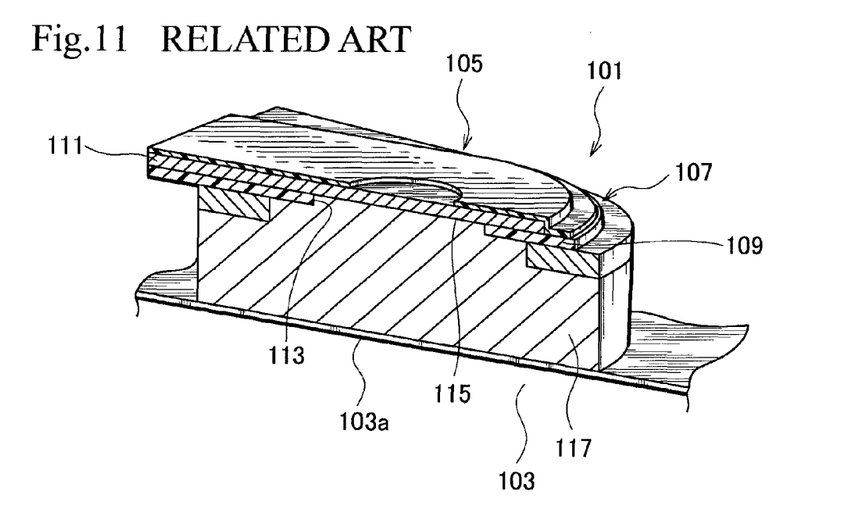
FIG. 11 is a sectional perspective view illustrating an electrical connection structure according to a related art.

Among the dual-actuator-system head suspensions, some employ an electrical connection structure 101 illustrated in FIG. 11.

In FIG. 11, the electrical connection structure 101 includes an electrode 103a of a piezoelectric element 103 and a terminal 107 of a flexure 105 serving as a wiring member. The electrode 103a and terminal 107 are arranged to face each other and are fixed together.

The flexure 105 has an insulating layer 109 and a wiring pattern 111 that is laid on the insulating layer 109. At the terminal 107 of the flexure 105, the insulating layer 109 has a through hole 113. The through hole 113 defines a connection part 115 where the wiring pattern 111 is exposed toward the piezoelectric element 103. The connection part 115 of the flexure 105 is fixed and connected to the electrode 103a of the piezoelectric element 103 with a conductive adhesive 117.

In the electrical connection structure 101, the connection part 115 of the flexure 105 supplies power through the conductive adhesive 117 to the electrode 103a of the piezoelectric element 103.

Figure 12:
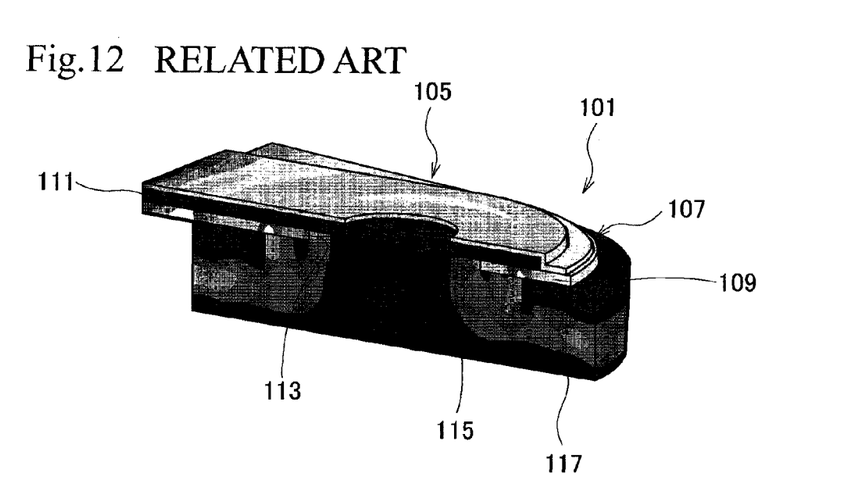
FIG. 12 is a sectional perspective view illustrating a stress distribution of the electrical connection structure of FIG. 11.

When the power is supplied, various parts of the electrical connection structure 101 receive stress due to thermal expansion as illustrated in FIG. 12. In particular, a part between the conductive adhesive 117 and the electrode 103a of the piezoelectric element 103 and a part between the conductive adhesive 117 and the connection part 115 of the terminal 107 of the flexure 105 suffer from relatively high stress due to thermal expansion. In FIG. 12, parts illustrated with darker colors are suffering from higher stress.

The electrode 103a of the piezoelectric element 103 has a rough surface because of a rough surface condition of the piezoelectric element 103, and therefore, a bonding strength between the electrode 103a and the conductive adhesive 117 is relatively high. Accordingly, the part between the electrode 103a of the piezoelectric element 103 and the conductive adhesive 117 is resistive to the relatively high stress caused by thermal expansion.

On the other hand, the surface of the connection part 115 of the terminal 107 of the flexure 105 is smoother than the surface of the electrode 103a of the piezoelectric element 103. A bonding strength between the connection part 115 and the conductive adhesive 117, therefore, is relatively low. Due to this, the conductive adhesive 117 easily peels off the connection part 115 if the stress due to thermal expansion is excessive.

SUMMARY OF THE INVENTION

An object of the present invention is to provide an electrical connection structure for a piezoelectric element, capable of preventing a conductive adhesive, which fixes an electrode of the piezoelectric element to a terminal of a wiring member, from peeling off the terminal due to thermal expansion. Another object of the present invention is to provide a head suspension employing the electrical connection structure.

In order to accomplish the objects, an aspect of the present invention provides an electrical connection structure fixing and connecting a terminal of a wiring member to an electrode of the piezoelectric element that is arranged to face the terminal with a conductive adhesive, the electrical connection structure including a through hole formed through the terminal and a connection part formed around the through hole on the opposite side of a piezoelectric element on the terminal. The conductive adhesive is applied and solidified so that the conductive adhesive extends between a surface of the connection part and a surface of the electrode of the piezoelectric element through the through hole.

According to this aspect of the present invention, the conductive adhesive solidifies on the top face of the connection part around the through hole on the opposite side of the piezoelectric element side of the terminal. This configuration reduces stress caused by thermal expansion between the connection part and the conductive adhesive and suppresses peeling between them.

DETAILED DESCRIPTION OF EMBODIMENTS

Embodiments of the present invention will be explained. Each embodiment provides an electrical connection structure for a piezoelectric element, the electrical connection structure fixing and connecting a terminal of a wiring member to an electrode of the piezoelectric element that is arranged to face the terminal with a conductive adhesive so that no peeling due to thermal expansion occurs between the terminal and the conductive adhesive.

For this, the electrical connection structure includes a through hole formed through the terminal and a connection part formed around the through hole on the opposite side of a piezoelectric element on the terminal. The conductive adhesive is applied and solidified so that the conductive adhesive extends between a top face of the connection part and a surface of the electrode of the piezoelectric element through the through hole.

Preferably, the wiring member includes an insulating layer that faces the electrode of the piezoelectric element and a wiring pattern formed on the insulating layer. In this case, the through hole of the terminal is formed to pass through the insulating layer and wiring pattern and the connection part of the terminal is made from a part of the wiring pattern that is present around the through hole.

Further, it is preferable that the diameter of the through hole in the wiring part is equal to or greater than the diameter thereof in the insulating layer.

Hereinafter, each embodiment will be individually explained with reference to the drawings.

Figure 1:
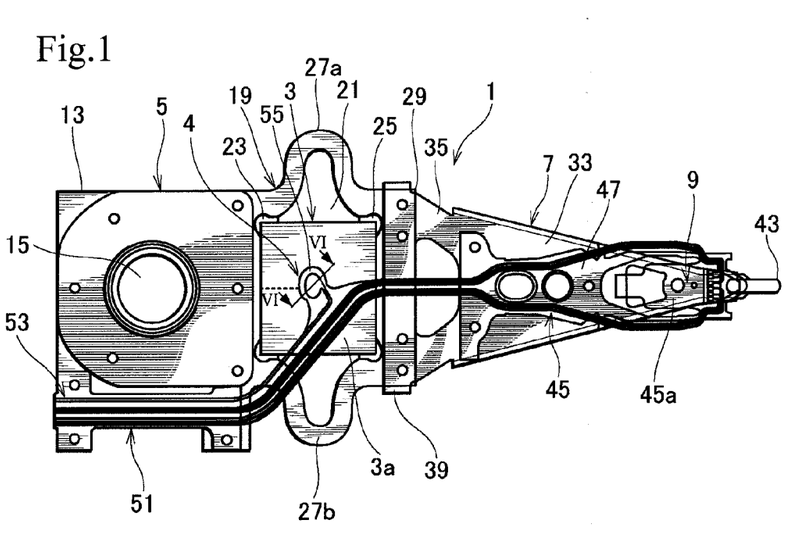
FIG. 1 is a plan view schematically illustrating a head suspension with an electrical connection structure for a piezoelectric element according to a first embodiment of the present invention.
Figure 2:
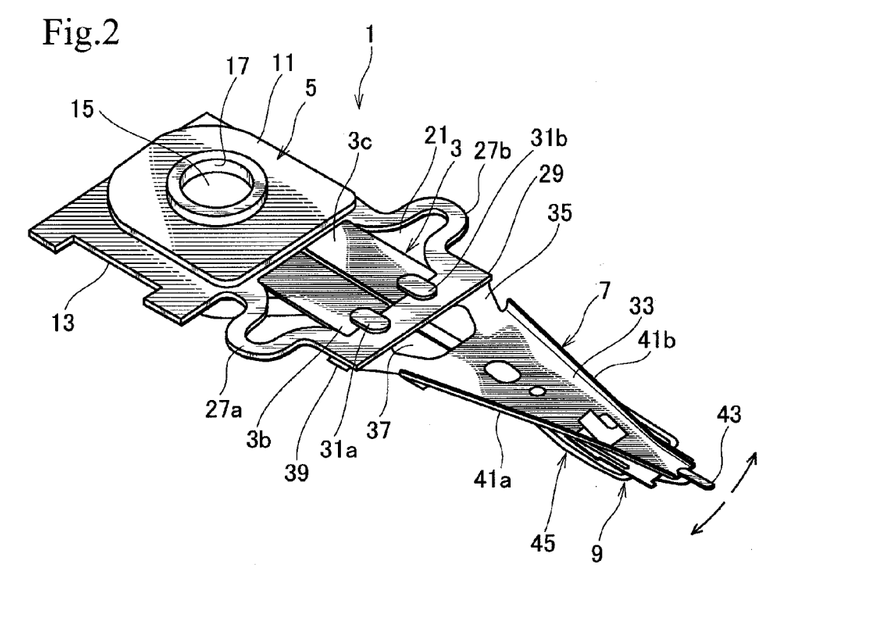
FIG. 2 is a perspective view illustrating the head suspension of FIG. 1.

FIG. 1 is a plan view schematically illustrating a head suspension employing an electrical connection structure for a piezoelectric element according to a first embodiment of the present invention and FIG. 2 is a perspective view illustrating the head suspension of FIG. 1.

The head suspension 1 includes the piezoelectric element 3 for which the electrical connection structure 4 according to the first embodiment of the present invention is applied. The head suspension 1 also includes a base 5, a load beam 7 attached to the base 5, and a read-write head 9 attached to a front end of the load beam 7.

The piezoelectric element 3 has a rectangular shape and is made of piezoelectric ceramics such as PZT (lead zirconate titanate). A first surface of the piezoelectric element 3 is provided with a common electrode 3a made by gold plating and a second surface thereof is provided with a pair of electrodes 3b and 3c made by gold plating.

The piezoelectric element 3 is arranged between the base 5 and the load beam 7 and is deformed in proportion to a voltage applied thereto through the electrodes 3a, 3b and 3c. The deformation of the piezoelectric element 3 minutely moves the load beam 7 relative to the base 5, thereby slightly moving the read-write head 9 for a very short distance in a sway direction (a widthwise direction of the load beam 7).

The base 5 includes a base plate 11 made of conductive material such as stainless steel and a reinforcing plate 13 made of conductive material such as stainless steel. A base end part of the reinforcing plate 13 is laid on the base plate 11 and is joined thereto by, for example, laser welding.

A through hole 15 is formed through both the base plate 11 and reinforcing plate 13. The base plate 11 has an integral boss 17 that is fitted to a hole of a carriage (not illustrated) by swaging, the carriage being attached to a voice coil motor (not illustrated). The voice coil motor is driven to turn the carriage so as to turn the head suspension 1.

The voice coil motor and piezoelectric element 3 form the dual actuator system in which the voice coil motor turns the head suspension 1 and the piezoelectric element 3 minutely drives the read-write head 9.

A front end part of the reinforcing plate 13 serves as a fitting part 19 for the piezoelectric element 3. The fitting part 19 has an opening 21 in which the piezoelectric element 3 is arranged. The opening 21 includes receivers 23 and 25 formed by etching the fitting part 19. The piezoelectric element 3 is fixed in the fitting part 19 with a nonconductive adhesive. On each side of the opening 21 in a sway direction, there are flexible parts 27a and 27b.

A front end of the fitting part 19 is a fixing part 29 to which the load beam 7 is fixed. Between the fixing part 29 and the electrodes 3b and 3c of the piezoelectric element 3, conductive adhesives 31a and 31b are applied to electrically connect the electrodes 3b and 3c to the reinforcing plate 13.

The load beam 7 applies load onto the read-write head 9 attached to the front end of the load beam 7. The load beam 7 is made of, for example, a stainless steel thin plate and includes a rigid part 33 and a resilient part 35.

The resilient part 35 is branched by a window 37, to reduce bending rigidity in a thickness direction. A base end of the resilient part 35 is a fixing part 39 that is fixed to the fixing part 29 of the base 5 by, for example, laser welding.

Along each edge of the rigid part 33, bends 41a and 41b are formed in a thickness direction by box-bending. The bends 41a and 41b extend between front and base ends of the rigid part 33.

The front end of the rigid part 33 is provided with a load-unload tab 43 and a dimple (not illustrated).

The read-write head 9 has a slider that is supported by a tongue 45a of a flexure (wiring member) 45.

Figure 3:
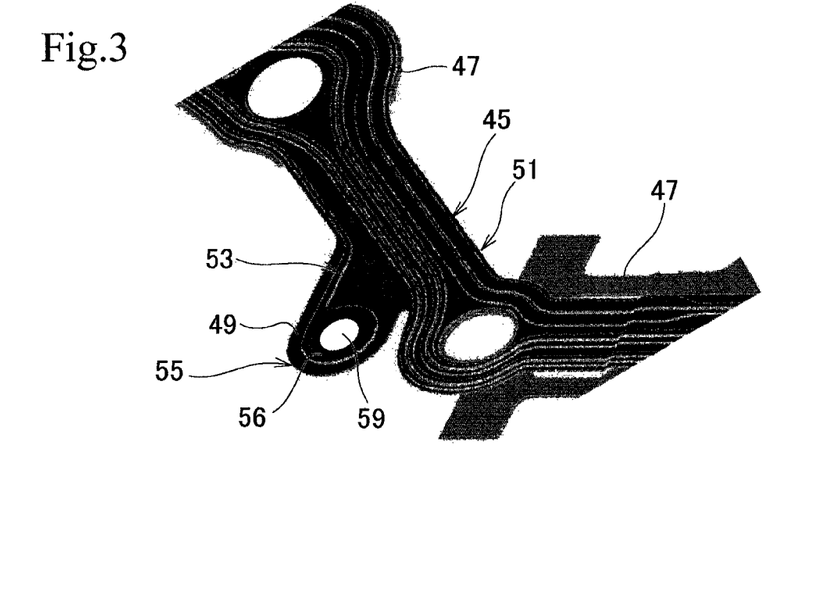
FIG. 3 is a partial perspective view illustrating an area around a terminal of a flexure of the head suspension of FIG. 1.
Figure 4:
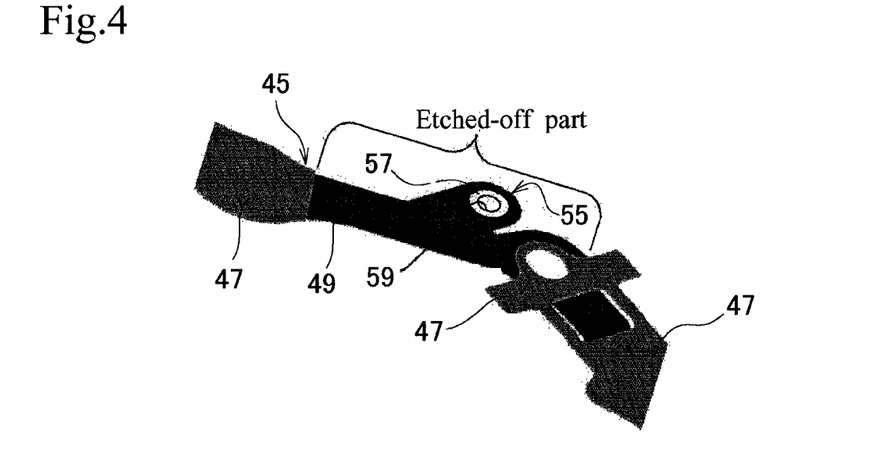
FIG. 4 is a partial perspective view illustrating the opposite side of the area illustrated in FIG. 3.
Figure 5A:
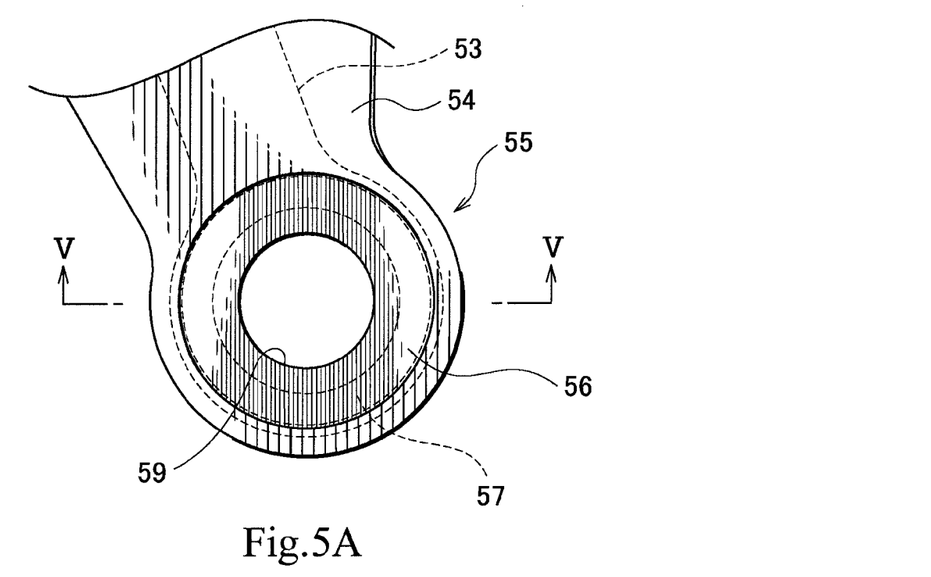
FIG. 5A is a plan view illustrating the terminal of electrical connection structure according to the first embodiment.
Figure 5B:
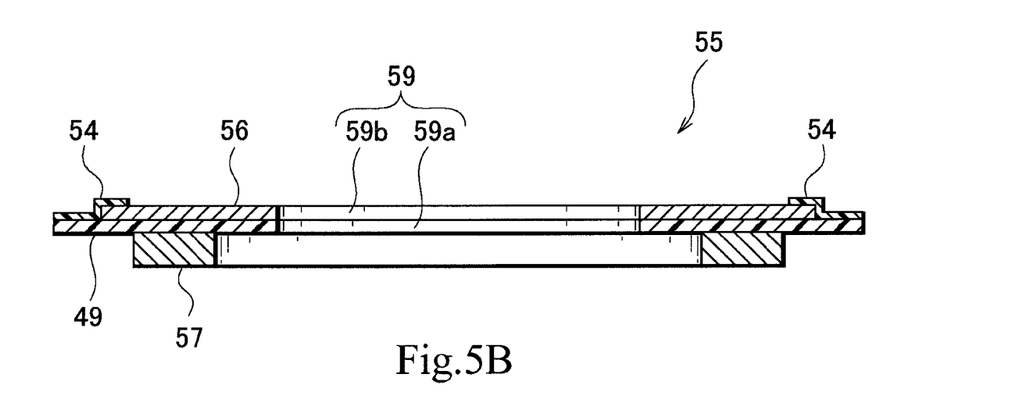
FIG. 5B is a sectional view taken along a line V-V of FIG. 5A.

FIG. 3 is a partial perspective view illustrating an area around a terminal 55 of the flexure 45 of the head suspension 1 of FIG. 1, FIG. 4 is a partial perspective view illustrating an opposite side of the area illustrated in FIG. 3, FIG. 5A is a plan view illustrating the terminal 55 of the electrical connection structure 4 according to the first embodiment, and FIG. 5B is a sectional view taken along a line V-V of FIG. 5A. Although the flexure 45 has slightly different shapes in FIGS. 1 to 5, these figures illustrate the same flexure 45.

The flexure 45 has a layered structure including a conductive thin plate 47 such as a resilient thin stainless steel rolled plate (SST), an insulating layer 49 formed on the thin plate 47, and copper wiring patterns 51 and 53 formed on the insulating layer 49. A surface of the flexure 45 opposite to a surface facing the piezoelectric element 3 is covered with a cover insulating layer 54. The cover insulating layer 54 may be omitted.

The thickness range of the conductive thin plate 47 is about 10 to 25 μm, that of the insulating layer 49 is about 5 to 15 μm, that of the wiring patterns 51 and 53 is about 8 to 15 μm, and that of the cover insulating layer 54 is about 1 to 5 μm.

An end of the wiring pattern 51 is electrically connected to read and write terminals supported by the slider of the read-write head 9. An end of the wiring pattern 53 is connected to the terminal 55 that faces the piezoelectric element 3. Between the piezoelectric element 3 and the terminal 55, the electrical connection structure 4 is applied. The other ends of the wiring patterns 51 and 53 are connected to external connection terminals (not illustrated), respectively.

Figure 6:
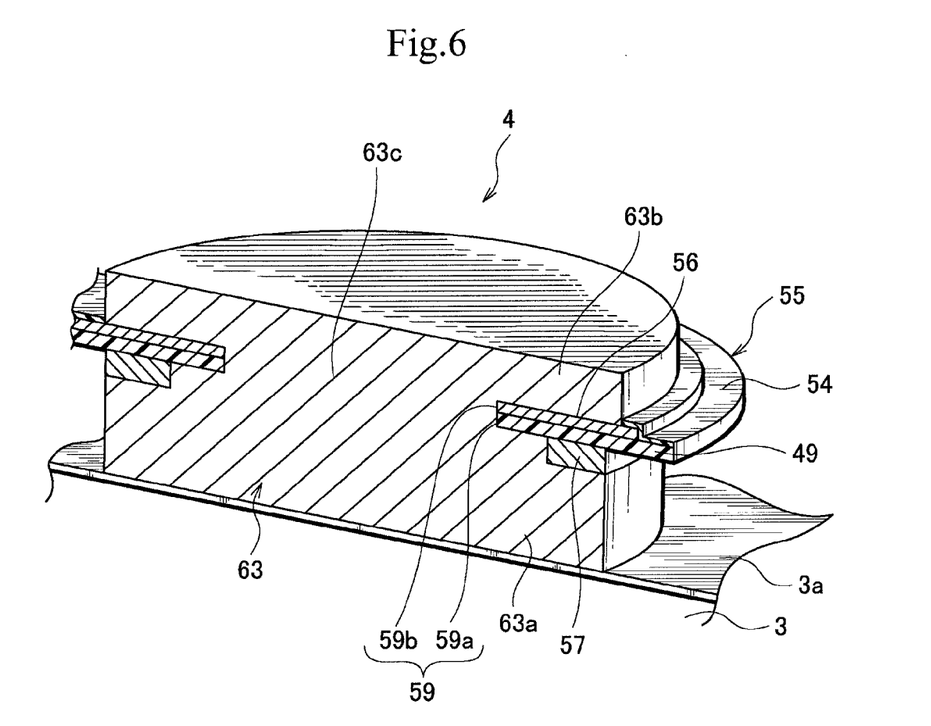
FIG. 6 is a sectional perspective view taken along a line VI-VI of FIG. 1.

The electrical connection structure 4 will be explained. FIG. 6 is a sectional perspective view taken along a line VI-VI of FIG. 1.

In FIG. 6, the electrical connection structure 4 fixes and connects a conductive adhesive 63 to a connection part 56 of the terminal 55 on a side opposite to a side facing the piezoelectric element 3, i.e., on the opposite side of the piezoelectric element 3.

As illustrated in FIGS. 3 to 6, the conductive thin plate 47 of the flexure 45 is removed from around the terminal 55 by, for example, etching. The terminal 55 is provided with a through hole 59.

The through hole 59 is formed through the insulating layer 49 and wiring pattern 53. Namely, the through hole 59 includes an insulating layer hole 59a formed through the insulating layer 49 and a wiring pattern hole 59b formed through the wiring pattern 53. The insulating layer hole 59a and wiring pattern hole 59b have the same diameter. The wiring pattern hole 59b may have a larger diameter than the insulating layer hole 59a.

Namely, in the through hole 59, the diameter of the wiring pattern hole 59b is set to be equal to or larger than the diameter of the insulating layer hole 59a.

The connection part 56 is a part of the wiring pattern 53, has a ring shape, and is formed around the through hole 59. A surface or top face of the connection part 56 is exposed by removing the cover insulating layer 54.

In this way, the connection part 56 is formed around the through hole 59 on the opposite side of the piezoelectric element 3 on the terminal 55.

A bottom face of the connection part 56 is covered and supported with the insulating layer 49, so that the connection part 56 may not expose to the piezoelectric element 3.

On the other side of the terminal 55 facing the piezoelectric element 3 (also referred to as piezoelectric element side), a ring 57 serving as a stopper protrudes from the insulating layer 49. The ring 57 is made of, for example, stainless steel, is formed by partly leaving the conductive thin plate 47 around the through hole 59, and is positioned at a diametrical intermediate part with respect to the bottom face of the connection part 56.

The conductive adhesive 63 is applied and solidified from the top face of the connection part 56 of the terminal 55 to the electrode 3a of the piezoelectric element 3 through the through hole 59. The solidified conductive adhesive 63 is present on each side of the terminal 55 and has a sectional shape like an I-beam.

On the piezoelectric element side of the terminal 55, the conductive adhesive 63 forms a first fixation 63a adhered to the electrode 3a of the piezoelectric element 3. The first fixation 63a is defined with the ring 57 serving as a stopper that blocks the conductive adhesive 63 before solidification from oozing from between the terminal 55 and the piezoelectric element 3. More precisely, the ring 57 narrows a space between the electrode 3a of the piezoelectric element 3 and the terminal 55 so that the conductive adhesive 63 before solidification enters, due to capillary phenomenon, the space between the electrode 3a and the ring 57 and solidifies thereat.

As a result, the first fixation 63a forms a stepped cylindrical shape between the ring 57 and the electrode 3a of the piezoelectric element 3 within the periphery of the ring 57.

On the opposite side of the piezoelectric element 3, the conductive adhesive 63 forms a second fixation 63b adhering to the connection part 56 of the terminal 55. The second fixation 63b has a cylindrical shape that radially extends from the through hole 59. An outer peripheral portion of the second fixation 63b is on the top face of the connection part 56 of the terminal 55 and adheres thereto.

The first and second fixations 63a and 63b are integrally connected to each other through an interconnection 63c in the through hole 59. The interconnection 63c adheres to inner circumferences of the insulating layer hole 59a and wiring pattern hole 59b and has a cylindrical shape.

In the conductive adhesive 63, the second fixation 63b and interconnection 63c are conductive to the top and inner circumferential faces of the connection part 56 of the terminal 55 and the first fixation 63a is conductive to the electrode 3a of the piezoelectric element 3. Consequently, the conductive adhesive 63 establishes electrical conduction between the connection part 56 of the terminal 55 and the electrode 3a of the piezoelectric element 3, to transfer power from the terminal 55 to the piezoelectric element 3 through the conductive adhesive 63.

When power is supplied, stress due to thermal expansion may occur between the conductive adhesive 63 and the connection part 56 of the terminal 55. The embodiment reduces such stress.

This is because the electrical connection structure 4 according to the embodiment fixes the second fixation 63b of the conductive adhesive 63 to the top face of the connection part 56 arranged around the through hole 59 on the opposite side of the piezoelectric element 3.

As a result, the second fixation 63b is open or free on the opposite side of the connection part 56 and the through hole 59 reduces a surface-direction strength of the connection part 56.

This results in easing restrictions on the top face of the connection part 56 and reducing stress due to thermal expansion at an interface between the connection part 56 and the second fixation 63b.

On the bottom face side of the connection part 56, the first fixation 63a of the conductive adhesive 63 adheres to the insulating layer 49, to weaken the biting of the conductive adhesive 63. This also reduces stress due to thermal expansion between the bottom face of the connection part 56 and the first fixation 63a.

Although relatively high stress occurs due to thermal expansion between the conductive adhesive 63 and the electrode 3a of the piezoelectric element 3, a bonding strength between them is relatively high like the related art, and therefore, is resistive to such high stress.

Figure 7A:
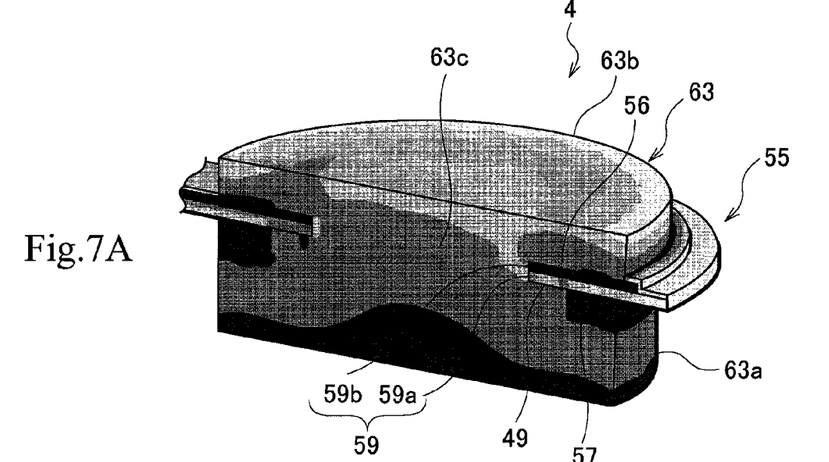
FIG. 7A is a sectional perspective view illustrating a stress distribution of the electrical connection structure of FIG. 6.
Figure 7B:
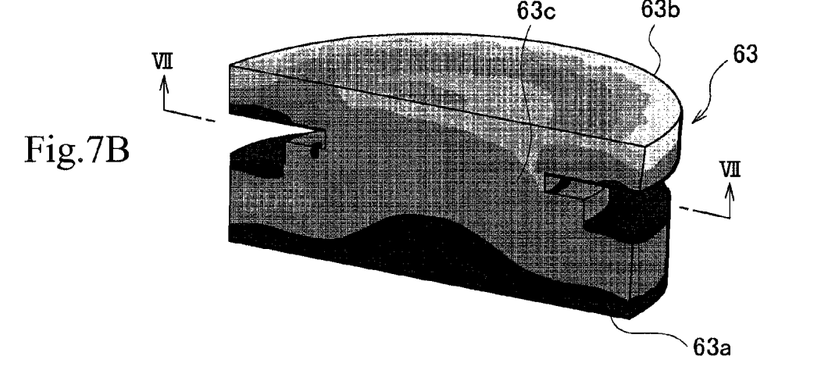
FIG. 7B is a sectional perspective view illustrating a stress distribution of only a conductive adhesive of the electrical connection structure of FIG. 6.
Figure 7C:
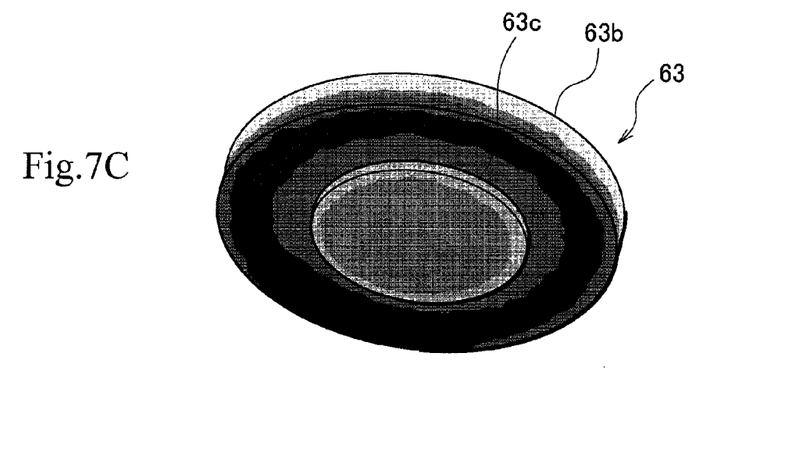
FIG. 7C is a sectional perspective view taken along a line VII-VII of FIG. 7B.

FIG. 7A is a sectional perspective view illustrating a stress distribution of the electrical connection structure 4 of FIG. 6, FIG. 7B is a sectional perspective view illustrating a stress distribution of only the conductive adhesive 63 of the electrical connection structure 4, and FIG. 7C is a sectional perspective view taken along a line VII-VII of FIG. 7B. Data used to prepare the stress distributions of FIGS. 7A to 7C are obtained by restricting the interface between the piezoelectric element 3 and the conductive adhesive 63 and a base end of the terminal 55 and by increasing temperature from 20° C. to 140° C. In FIGS. 7A to 7C, parts illustrated with darker colors suffer from higher stress.

It is admitted in FIGS. 7A to 7C that the electrical connection structure 4 reduces stress due to thermal expansion between the connection part 56 of the terminal 55 and the second fixation 63b of the conductive adhesive 63.

It is also admitted that, on the bottom face side of the connection part 56, the electrical connection structure 4 reduces stress due to thermal expansion between the connection part 56 and the first fixation 63a of the conductive adhesive 63.

The first embodiment provides following effects.

According to the first embodiment, the electrical connection structure 4 has the through hole 59 formed through the terminal 55 and the connection part 56 formed around the through hole 59 on the opposite side of the piezoelectric element 3. The conductive adhesive 63 is applied and solidified from the top face of the connection part 56 to the surface of the electrode 3a of the piezoelectric element 3 through the through hole 59.

The conductive adhesive 63 adheres to the top face of the connection part 56 around the through hole 59 on the opposite side of the piezoelectric element 3. This configuration reduces restrictions on the top face of the connection part 56, thereby decreasing stress caused by thermal expansion at an interface between the connection part 56 and the conductive adhesive 63, preventing peeling from occurring between them, and securing long-term reliability of electrical connection between them.

According to the embodiment, the flexure 45 has the insulating layer 49 facing the electrode 3a of the piezoelectric element 3 and the wiring patterns 51 and 53 formed on the insulating layer 49. The terminal 55 of the flexure 45 has the through hole 59 formed through the insulating layer 49 and wiring pattern 53. The connection part 56 of the terminal 55 is formed from the wiring pattern 53 around the through hole 59.

With this configuration, the electrical connection structure 4 surely prevents the conductive adhesive 63 from peeling off the terminal 55 due to thermal expansion.

According to the embodiment, the diameter of the through hole 59 in the wiring pattern 53 is equal to or greater than that in the insulating layer 49.

This configuration surely supports the bottom face of the connection part 56 with the insulating layer 49 and improves the rigidity of the connection part 56 around the through hole 59.

The insulating layer 49 is fixed to the conductive adhesive 63 on the bottom face side of the connection part 56, to weaken the biting of the conductive adhesive 63 on the bottom face side of the connection part 56. This configuration reduces stress due to thermal expansion between the bottom face of the connection part 56 and the conductive adhesive 63, prevents the conductive adhesive 63 from peeling off the terminal 55 due to thermal expansion, and secures long-term reliability of electrical connection between them.

According to the embodiment, the connection part 56 has a ring shape to relax restrictions on the whole surface of the connection part 56.

According to the embodiment, the electrical connection structure 4 includes the ring 57 that protrudes from the piezoelectric element side of the insulating layer 49 of the flexure 45 around the through hole 59 toward the piezoelectric element 3. The ring 57 serves as a stopper to block the conductive adhesive 63 before solidification from oozing out of the periphery of the ring 57.

The ring 57 functions to equalize the conductive adhesive 63 between the piezoelectric element 3 and the terminal 55 and enhance the biting of the conductive adhesive 63 in whole to the terminal 55 and piezoelectric element 3.

This configuration improves a bonding strength between the piezoelectric element 3 and the terminal 55 and surely adheres the piezoelectric element 3 and terminal 55 to each other even if the biting of the conductive adhesive 63 to the bottom face side of the connection part 56 is relatively low.

The head suspension 1 employing the electrical connection structure 4 according to the embodiment demonstrates improved reliability of electrical connection between the piezoelectric element 3 and the terminal 55 of the flexure 45 and carries out highly accurate positioning of the read-write head 9.

Figure 8:
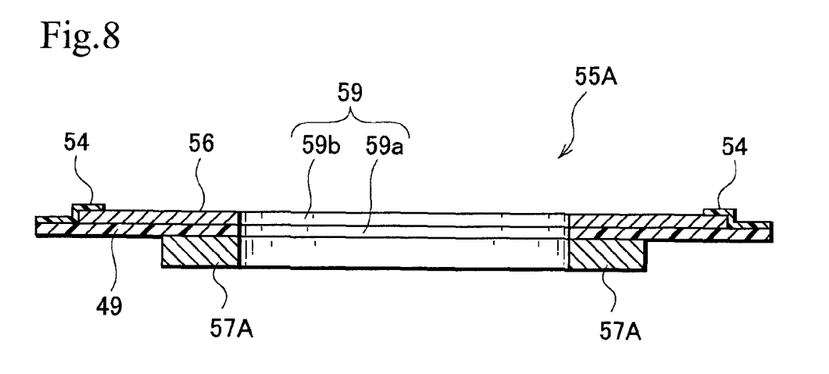
FIG. 8 is a sectional view illustrating a terminal of an electrical connection structure according to a modification of the first embodiment.

FIG. 8 is a sectional view illustrating a terminal of an electrical connection structure according to a modification of the first embodiment. The electrical connection structure according to the modification is basically the same as that of the first embodiment, and therefore, corresponding parts are represented with like reference marks, or like reference marks plus "A" to omit overlapping explanation.

In FIG. 8, the inner diameter of a ring 57A made of, for example, stainless steel is equal to the diameter of a through hole 59. Corresponding to this, the outer diameter of the ring 57A is smaller than that of the ring 57 of the first embodiment.

This modification provides the same effect as the first embodiment.

Figure 9:
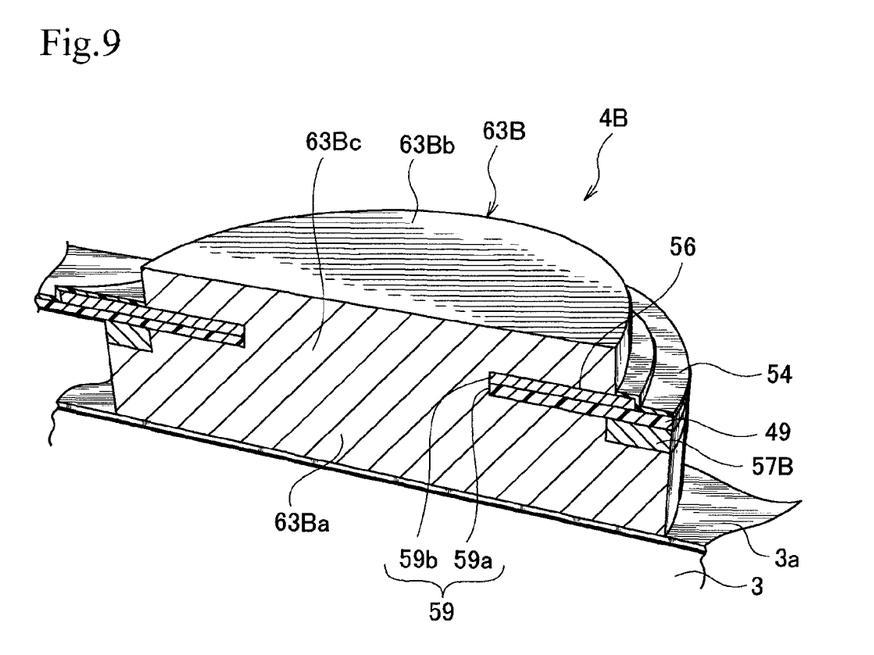
FIG. 9 is a sectional perspective view illustrating an electrical connection structure according to a second embodiment of the present invention.

FIG. 9 is a sectional perspective view illustrating an electrical connection structure according to a second embodiment of the present invention. The electrical connection structure of the second embodiment is basically the same as that of the first embodiment, and therefore, corresponding parts are represented with like reference marks, or like reference marks plus "B" to omit overlapping explanation.

In FIG. 9, the electrical connection structure 4B according to the second embodiment includes a ring 57B that is made of, for example, stainless steel and is not overlapping a connection part 56 of a terminal 55B in a thickness direction.

The inner diameter of the ring 57B is equal to or greater than the outer diameter of the connection part 56. The ring 57B is annular and is positioned outside the connection part 56. According to the second embodiment, the inner diameter of the ring 57B is equal to the outer diameter of the connection part 56 and the outer diameter of a second fixation 63Bb of a conductive adhesive 63B.

The ring 57B is not positioned under the connection part 56, and therefore, never pulls or restricts the connection part 56. This configuration reduces stress between the connection part 56 and the second fixation 63Bb of the conductive adhesive 63B.

Figure 10A:
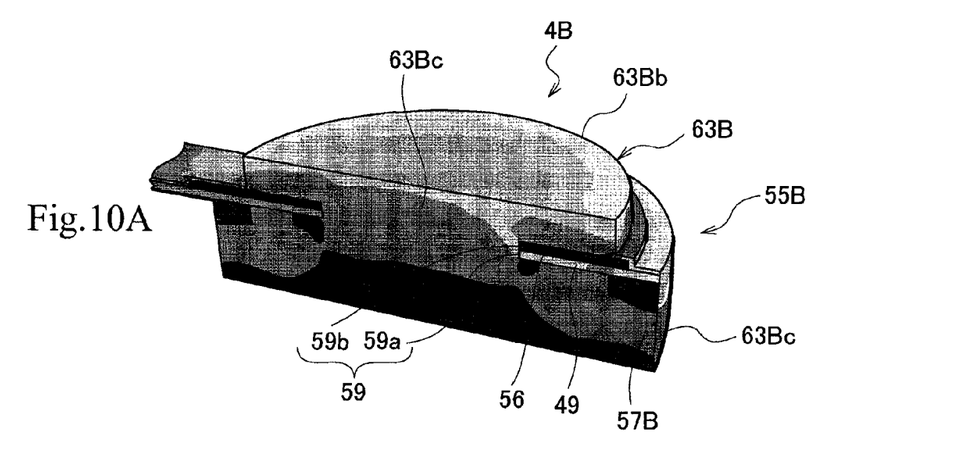
FIG. 10A is a sectional perspective view illustrating a stress distribution of the electrical connection structure of FIG. 9.
Figure 10B:
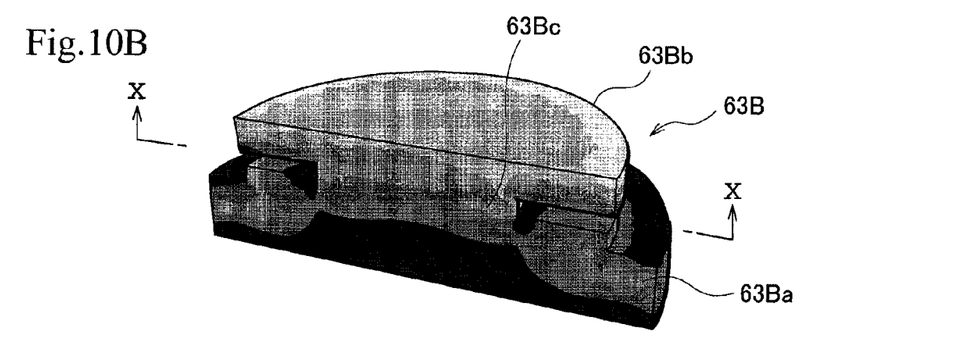
FIG. 10B is a sectional perspective view illustrating a stress distribution of only a conductive adhesive of the electrical connection structure of FIG. 9.
Figure 10C:
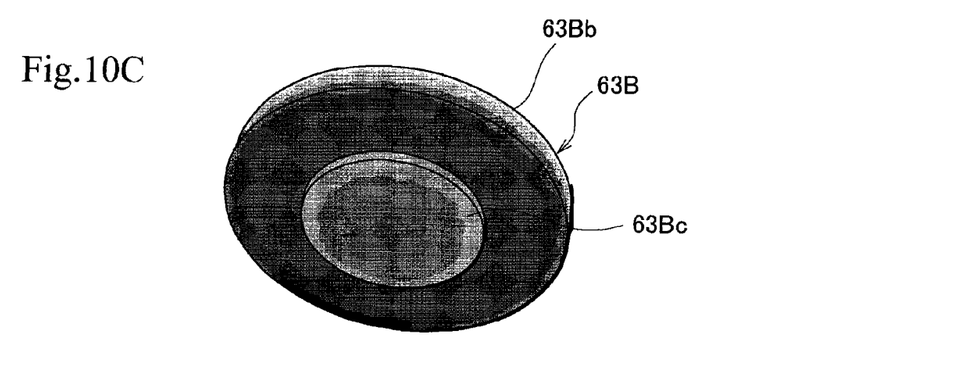
FIG. 10C is a sectional perspective view taken along a line X-X of FIG. 10B.

FIG. 10A is a sectional perspective view illustrating a stress distribution of the electrical connection structure 413 of FIG. 9, FIG. 10B is a sectional perspective view illustrating a stress distribution of only the conductive adhesive 63B of the electrical connection structure 4B, and FIG. 10C is a sectional perspective view taken along a line X-X of FIG. 10B. The stress distributions of FIGS. 10A to 10C are obtained according to the same conditions as those used to obtain the stress distributions of FIGS. 7A to 7C. Parts illustrated with darker colors are suffering from higher stress.

The first embodiment illustrated in FIGS. 7A to 7C reduces stress between the connection part 56 and the second fixation 63b of the conductive adhesive 63. According to the first embodiment, however, high stress remains in an area where the second fixation 63b overlaps the ring 57.

On the other hand, the second embodiment of FIGS. 10A to 10C (in particular, FIG. 10C) reduces stress in an entire area between the connection part 56 of the terminal 55B and the second fixation 63Bb of the conductive adhesive 63B.

In this way, the electrical connection structure 4B according to the second embodiment reduces stress in an entire area between the connection part 56 of the terminal 55B and the second fixation 63Bb of the conductive adhesive 63B. Accordingly, the second embodiment more surely prevents the conductive adhesive 63B from peeling off the terminal 55 due to thermal expansion and secures long-term reliability of electrical connection between them.

The effect provided by the first embodiment is also provided by the second embodiment.

What is claimed is:

1. An electrical connection structure for a piezoelectric element, the electrical connection structure fixing and connecting a terminal of a wiring member to an electrode of the piezoelectric element that is arranged to face the terminal with a conductive adhesive, the electrical connection structure comprising:
    a through hole formed through the terminal;
    a connection part formed around the through hole on an opposite side of a piezoelectric element on the terminal; and
    the conductive adhesive being applied and solidified so that the conductive adhesive extends from a top face of the connection part to a surface of the electrode of the piezoelectric element through the through hole, and
    wherein the top face of the connection part is arranged on an opposite side of the piezoelectric element on the terminal and extends radially outward with respect to the through hole.

2. The electrical connection structure of claim 1, wherein the wiring member includes an insulating layer that faces the electrode of the piezoelectric element and a wiring pattern that is laid on the insulating layer,
    the through hole of the terminal is formed to pass through the insulating layer and wiring pattern, and
    the connection part of the terminal is made from a part of the wiring pattern that is present around the through hole.

3. The electrical connection structure of claim 2, wherein the diameter of the through hole in the wiring pattern is equal to or greater than the diameter of the through hole in the insulating layer.

4. The electrical connection structure of claim 2, further comprising a stopper that protrudes around the through hole from a side of the insulating layer facing the piezoelectric element on the terminal and stops the conductive adhesive before solidification from oozing out of the periphery of the stopper.

5. The electrical connection structure of claim 4, wherein the stopper is positioned outside the connection part so that the stopper does not overlap the connection part in a thickness direction.

6. The electrical connection structure of claim 4, wherein the stopper has a ring shape whose inner diameter is greater than the outer diameter of the connection part.

7. The electrical connection structure of claim 1, wherein the connection part has a ring shape.

8. A head suspension including the electrical connection structure of claim 1 for a piezoelectric element, comprising:
    a base and a load beam connected to the base;
    a read-write head attached to a front end of the load beam; and
    the piezoelectric element being arranged between the base and the load beam and being deformed in proportion to a voltage applied thereto, to displace the load beam relative to the base and thereby minutely move the read-write head in a sway direction.

9. The electrical connection structure of claim 1, wherein the conductive adhesive overlaps said top face to extend and adhere along the top face, said top face being at an opposite face of the connection part than a face of the connection part facing said electrode of the piezoelectric element.

10. The electrical connection structure of claim 1, wherein the conductive adhesive extends along a portion of the top face of the connection part radially outward beyond a portion of the conductive adhesive within the through hole through the terminal, said top face being at an opposite face of the connection part than a face of the connection part facing said electrode of the piezoelectric element.

11. The electrical connection structure of claim 1, wherein the conductive adhesive includes:
    a first fixation formed between the terminal and the piezoelectric element and adhering to the electrode of the piezoelectric element;
    a second fixation radially extending from the through hole on the opposite side of the piezoelectric element on the terminal so as to be positioned on the top face of the connection part of the terminal and adhering thereto; and
    an interconnection formed in the through hole so that the first and second fixations are connected to each other through the interconnection.

12. The electrical connection structure of claim 1, wherein the conductive adhesive as a solidified structure comprises:
    a first portion from a height commencing at the top surface of the connection part and extending in a direction away from the electrode of the piezoelectric element, said first portion extending along the top face of the connection part radially outward beyond a portion of the conductive adhesive within the through hole of the terminal;
    a second portion bordered by a peripheral wall defining the through hole; and
    a third portion extending from a height at a base of the through hole to the electrode, the third portion adhering to the electrode of the piezoelectric element.

* * * * *